United States Patent
Hiramatsu et al.

(10) Patent No.: US 6,825,555 B2
(45) Date of Patent: Nov. 30, 2004

(54) HOT PLATE

(75) Inventors: Yasuji Hiramatsu, Gifu (JP); Yasutaka Ito, Gifu (JP)

(73) Assignee: Ibiden Co., Ltd., Ogaki (JP)

( * ) Notice: Subject to any disclaimer, the term of this patent is extended or adjusted under 35 U.S.C. 154(b) by 0 days.

(21) Appl. No.: 10/048,989

(22) PCT Filed: Jun. 15, 2001

(86) PCT No.: PCT/JP01/05147
§ 371 (c)(1), (2), (4) Date: May 29, 2002

(87) PCT Pub. No.: WO01/97264
PCT Pub. Date: Dec. 20, 2001

(65) Prior Publication Data
US 2003/0010765 A1 Jan. 16, 2003

(30) Foreign Application Priority Data

Jun. 16, 2000 (JP) .................................... 2000-181941

(51) Int. Cl.⁷ .............................................. H01L 23/06
(52) U.S. Cl. ..................... 257/705; 324/557; 174/258; 174/262; 174/264
(58) Field of Search .............................. 427/123, 126.2; 428/312.6, 539.5; 174/258, 262, 264; 420/525, 558, 559; 324/557

(56) References Cited

U.S. PATENT DOCUMENTS

| | | | |
|---|---|---|---|
| 4,092,520 A | * | 5/1978 | Holmes et al. ............. 219/504 |
| 5,229,549 A | * | 7/1993 | Yamakawa et al. ......... 174/262 |
| 5,413,360 A | | 5/1995 | Atari et al. |
| 5,232,765 A | | 8/1995 | Yano et al. |
| 5,616,956 A | | 1/1997 | Horiguchi et al. |
| 5,665,260 A | | 9/1997 | Kawada et al. |
| 6,063,514 A | * | 5/2000 | Nishioka et al. ............ 428/698 |
| 6,465,763 B1 | | 10/2002 | Ito et al. |
| 6,475,606 B2 | | 11/2002 | Niwa |
| 6,507,006 B1 | | 1/2003 | Hiramatsu et al. |
| 2002/0043527 A1 | | 4/2002 | Ito |
| 2003/0015521 A1 | | 1/2003 | Ito |
| 2003/0054147 A1 | | 3/2003 | Niwa |

FOREIGN PATENT DOCUMENTS

| EP | 0 771 772 | 5/1997 |
|---|---|---|
| EP | 0 963 137 | 12/1999 |

(List continued on next page.)

OTHER PUBLICATIONS

U.S. patent application Ser. No. 10/663,681, Ito et al., filed Sep. 17, 2003.

(List continued on next page.)

*Primary Examiner*—David Nelms
*Assistant Examiner*—Mai-Huong Tran
(74) *Attorney, Agent, or Firm*—Oblon, Spivak, McClelland, Maier & Neustadt, P.C.

(57) ABSTRACT

An object of the present invention is to provide a hot plate which is superior in thermal conductivity, is superior in temperature-rising/dropping property, particularly in temperature-dropping property, and has high cooling thermal efficiency at the time of cooling. The hot plate of the present invention is a hotplate comprising: a ceramic substrate; and a resistance heating element formed on the surface of said ceramic substrate or inside said ceramic substrate, wherein said ceramic substrate has a leakage quantity of $10^{-7}$ Pa·m³/sec (He) or less by measurement with a helium leakage detector.

10 Claims, 5 Drawing Sheets

FOREIGN PATENT DOCUMENTS

| | | |
|---|---|---|
| EP | 1 225 157 | 7/2002 |
| EP | 1 225 790 | 7/2002 |
| JP | 3-138101 | 6/1991 |
| JP | 5-201766 | 8/1993 |
| JP | 5238710 | 9/1993 |
| JP | 6048840 | 2/1994 |
| JP | 6219850 | 8/1994 |
| JP | 7-126070 | 5/1995 |
| JP | 881265 | 3/1996 |
| JP | 9077561 | 3/1997 |
| JP | 11209171 | 8/1999 |
| JP | 11220012 | 8/1999 |
| JP | 11343168 | 12/1999 |
| JP | 2000063177 | 2/2000 |
| JP | 2000277239 | 10/2000 |
| JP | 2000277592 | 10/2000 |

OTHER PUBLICATIONS

U.S. patent application Ser. No. 09/946,463, Niwa, filed Sep. 6, 2001.
U.S. patent application Ser. No. 10/244,008, Niwa, filed Sep. 16, 2002.
U.S. patent application Ser. No. 10/670,354, Niwa, filed Sep. 26, 2003.
U.S. patent application Ser. No. 10/260,360, Niwa, filed Oct. 1, 2002.
U.S. patent application Ser. No. 10/759,083, Hiramatsu et al., filed Jan. 20, 2004.
U.S. patent application Ser. No. 10/386,615, Hiramatsu et al., filed Mar. 3, 2003.
U.S. patent application Ser. No. 10/387,452, Ito et al., filed Mar. 14, 2003.
U.S. patent application Ser. No. 10/658,454, Ito et al., filed Sep. 10, 2003.
U.S. patent application Ser. No. 10/442,967, Hiramatsu et al., filed May 22, 2003.
U.S. patent application Ser. No. 10/088,098, Ito et al., filed May 30, 2002.
U.S. patent application Ser. No. 10/618,651, Ito et al., filed Jul. 15, 2003.
U.S. patent application Ser. No. 10/618,623, Ito et al., filed Jul. 15, 2003.
U.S. patent application Ser. No. 10/618,655, Ito et al., filed Jul. 15, 2003.
U.S. patent application Ser. No. 10/618,665, Ito et al., filed Jul. 15, 2003.
U.S. patent application Ser. No. 10/615,950, Hiramatsu et al., filed Jul. 10, 2003.
U.S. patent application Ser. No. 10/619,567, Hiramatsu et al., filed Jul. 16, 2003.
U.S. patent application Ser. No. 10/697,287, Ito et al., filed Oct. 31, 2003.
U.S. patent application Ser. No. 10/397,321, Hiramatsu et al., filed Mar. 27, 2003.
U.S. patent application Ser. No. 10/718,535, Hiramatsu et al., filed Nov. 24, 2003.
U.S. patent application Ser. No. 10/048,989, Hiramatsu et al., filed May 29, 2002.
U.S. patent application Ser. No. 10/069,511, Ito et al., filed Jun. 24, 2002.
U.S. patent application Ser. No. 10/070,441, Ito et al., filed Jun. 26, 2002.
U.S. patent application Ser. No. 10/111,980, Ito et al., filed Jun. 27, 2002.
U.S. patent application Ser. No. 10/362,941, Ito, filed Apr. 28, 2003.
U.S. patent application Ser. No. 10/380,327, Hiramatsu et al., filed May 8, 2003.
U.S. patent application Ser. No. 10/343,833, Zhou et al., filed Sep. 22, 2003.
U.S. patent application Ser. No. 10/344,148, Kariya et al., filed Jul. 29, 2003.
U.S. patent application Ser. No. 10/398,393, Hiramatsu et al., filed Jan. 21, 2004.
U.S. patent application Ser. No. 10/363,310, Ito, filed Mar. 3, 2003.
U.S. patent application Ser. No. 10/473,585, Ito, filed Feb. 13, 2004.
U.S. patent application Ser. No. 09/917,749, Ito, filed Jul. 31, 2001.
U.S. patent application Ser. No. 10/345,356, Ito, filed Jan. 16, 2003.
U.S. patent application Ser. No. 09/915,418, Ito, filed Jul. 27, 2001.
U.S. patent application Ser. No. 10/356,519, Ito, filed Feb. 3, 2003.
U.S. patent application Ser. No. 10/217,029, Ito, filed Aug. 13, 2002.
U.S. patent application Ser. No. 09/979,676, Zhou, filed Nov. 5, 2001.
U.S. patent application Ser. No. 10/049,539, Zhou, filed Nov. 7, 2001.
U.S. patent application Ser. No. 10/048,894, Furukawa, filed Feb. 1, 2002.
U.S. patent application Ser. No. 09/890,358, Ito, filed Jul. 30, 2001.
U.S. patent application Ser. No. 09/916,682, Ito, filed Jul. 30, 2001.
U.S. patent application Ser. No. 10/222,928, Ito, filed Aug. 19, 2002.
U.S. patent application Ser. No. 10/182,009, Zhou, filed Jul. 24, 2002.
U.S. patent application Ser. No. 09/958,689, Furukawa et al., filed Oct. 10, 2001.
U.S. patent application Ser. No. 10/265,413, Ohashi, et al., filed Oct. 7, 2002.
U.S. patent application Ser. No. 09/926,296, Ito et al., filed Dec. 27, 2001.
U.S. patent application Ser. No. 10/346,095, Ito et al., filed Jan. 17, 2003.
U.S. patent application Ser. No. 09/471,759, Saito et al., filed Dec. 23, 1999.
U.S. patent application Ser. No. 09/462,067, Furukawa et al., filed Jan. 5, 2001.
U.S. patent application Ser. No. 09/787,954, Ito, filed Mar. 23, 2001.
U.S. patent application Ser. No. 09/787,816, Ito, filed Mar. 23, 2001.
U.S. patent application Ser. No. 09/787,818, Ito, filed Mar. 23, 2001.
U.S. patent application Ser. No. 09/806,957, Ito et al., filed Apr. 6, 2001.
U.S. patent application Ser. No. 09/926,730, Hiramatsu et al., filed Apr. 16, 2001.
U.S. patent application Ser. No. 09/880,742, Saito et al., filed Jun. 13, 2001.
U.S. patent application Ser. No. 09/880,359, Saito et al., filed Jun. 13, 2001.

U.S. patent application Ser. No. 09/880,379, Saito et al., filed Jun. 13, 2001.
U.S. patent application Ser. No. 09/673,953, Ito et al., filed Dec. 21, 2000.
U.S. patent application Ser. No. 09/524,010, Niwa, filed Mar. 13, 2000.
U.S. patent application Ser. No. 09/806,477, Ito et al., filed Jun. 25, 2001.
U.S. patent application Ser. No. 09/831,887, Ito et al., filed May 23, 2001.
U.S. patent application Ser. No. 09/807,960, Hiramatsu et al., filed May 18, 2001.
U.S. patent application Ser. No. 09/806,478, Ito et al., filed Jul. 26, 2001.
U.S. patent application Ser. No. 6,507,006, Hiramatsu et al., filed Jan. 14, 2003.
U.S. patent application Ser. No. 09/869,321, Zhou, filed Oct. 18, 2001.
U.S. patent application Ser. No. 6,465,763, Ito et al., filed Oct. 15, 2002.
U.S. patent application Ser. No. 09/926,012, Hiramatsu et al., filed Oct. 24, 2001.
U.S. patent application Ser. No. 09/926,092, Ito et al., filed Dec. 27, 2001.
U.S. patent application Ser. No. 09/926,297, Hiramatsu et al., filed Dec. 26, 2001.
U.S. patent application Ser. No. 09/926,362, Hiramatsu et al., filed Jan. 16, 2002.
U.S. patent application Ser. No. 09/926,465, Furukawa et al., filed Feb. 12, 2002.
U.S. patent application Ser. No. 09/926,464, Hiramatsu et al., filed Jan. 10, 2002.
U.S. patent application Ser. No. 09/926,499, Hiramatsu et al., filed Mar. 26, 2002.
U.S. patent application Ser. No. 09/926,714, Ito et al., filed Dec. 6, 2001.
U.S. patent application Ser. No. 09/926,713, Hiramatsu, filed Mar. 5, 2002.
U.S. patent application Ser. No. 10/009,174, Hiramatsu et al., filed Apr. 21, 2003.
U.S. patent application Ser. No. 10/009,480, Hiramatsu et al., filed Mar. 27, 2002.
U.S. patent application Ser. No. 10/019,448, Ito et al., filed Apr. 8, 2002.
U.S. patent application Ser. No. 09/926,800, Hiramatsu et al., filed Mar. 19, 2002.
U.S. patent application Ser. No. 10/019,444, Hiramatsu et al., filed Apr. 23, 2002.
U.S. patent application Ser. No. 10/019,280, Ito et al., filed Apr. 22, 2002.
U.S. patent application Ser. No. 10/019,311, Hiramatsu et al., filed Apr. 9, 2002.
U.S. patent application Ser. No. 10/030,123, Hiramatsu et al., filed May 16, 2002.
U.S. patent application Ser. No. 10/049,293, Ito et al., filed Apr. 30, 2002.
U.S. patent application Ser. No. 10/069,943, Ito et al., filed Jul. 10, 2002.
U.S. patent application Ser. No. 10/048,490, Ito et al., filed Apr. 30, 2002.
U.S. patent application Ser. No. 10/048,979, Hiramatsu et al., filed Apr. 26, 2002.
U.S. patent application Ser. No. 10/069,510, Hiramatsu et al., filed Jun. 20, 2002.
U.S. patent application Ser. No. 10/070,443, Hiramatsu et al., filed Jun. 24, 2002.
U.S. patent application Ser. No. 10/088,100, Ido, filed Jun. 26, 2002.
U.S. patent application Ser. No. 10/118,967, Ito et al., filed Apr. 10, 2002.
U.S. patent application Ser. No. 10/168,527, Hiramatsu et al., filed Jun 28, 2002.
U.S. Patent application Ser. No. 10/226,160, Ito et al., filed Aug. 23, 2002.
U.S. Patent application Ser. No. 10/229,177, Hiramatsu et al., filed Aug. 28, 2002.
U.S. Patent application Ser. No. 10/311,368, Ito et al., filed Dec. 16, 2002.
U.S. Patent application Ser. No. 10/352,138, Hiramatsu et al., filed Jan. 28, 2003.
U.S. Patent application Ser. No. 10/343,747, Ito et al., filed Feb. 6, 2003.
U.S. Patent application Ser. No. 6,475,606, Niwa, filed Nov. 5, 2002.
U.S. Patent application Ser. No. 10/416,497, Hiramatsu et al., filed May 19, 2003.

* cited by examiner (a)

(b)

(c)

(d)

(a)

(b)

(c)

(d)

HOT PLATE

TECHNICAL FIELD

The present invention relates to a hot plate which is used mainly in the semiconductor industry and has superior temperature-rising/dropping property.

BACKGROUND ART

Hitherto, a heater, a wafer prober and the like wherein a base material made of metal such as stainless steel or aluminum alloy is used has been used in semiconductor producing/examining devices and so on, examples of which include an etching device and a chemical vapor deposition device.

However, such a heater made of metal has the following problems.

First, the thickness of the heater plate has to be as thick as about 15 mm since the heater is made of metal. Because in a thin metal plate a bend, a strain and so on are generated on the basis of thermal expansion resulting from heating so that a silicon wafer put on the metal plate is damaged or inclined. However, if the thickness of the heater plate is made thick, a problem that the heater becomes heavy and bulky arises.

The temperature of a face for heating an object to be heated such as a silicon wafer (referred to as a heating face hereinafter) is controlled by changing the voltage or current amount applied to resistance heating elements. However, since the metal plate is thick, the temperature of the heater plate does not follow the change in the voltage or current amount promptly. Thus, a problem that the temperature is not easily controlled is caused.

Thus, JP Kokai Hei 11-40330 suggests a ceramic substrate (hot plate) wherein a nitride ceramic or a carbide ceramic, which has a high thermal conductivity and a great strength, is used as a substrate and resistance heating elements formed by sintering metal particles are set up on the surface of a plate made of this ceramic.

The hot plate having such a structure is usually put into a supporting case. At the time of cooling after heating is performed, a coolant is caused to flow into the supporting case in order to make cooling rate high. In this way, the ceramic substrate is rapidly cooled.

SUMMARY OF THE INVENTION

Although the hot plates using these ceramics are superior to heaters-made of metals in temperature-rising/dropping property, performance required for temperature-dropping property at the time of cooling with a coolant and the like is not sufficiently satisfied.

The inventors made eager investigations in order to solve the above-mentioned problems. As a result, the inventors have found the following: the reason why the temperature-dropping property of such a hot plate is insufficient is that, because of insufficient sinterability, a cooling gas is released to the outside through the sintered body at the time of cooling so that cooling thermal efficiency deteriorates; and thus the above-mentioned problems can be solved by adjusting the degree of the sintering in such a manner that the sintered body has a leakage quantity of $10^{-7}$ Pa·m$^3$/sec (He) or less by measurement with a helium leakage detector.

Specifically, the inventors have found that, by: firstly oxidizing the surface of raw material particles of a nitride ceramic and the like; adding an oxide thereto; and successively performing a sintering step under pressure and the like step, the leakage quantity thereof can be made as small as $10^{-7}$ Pa·m$^3$/sec (He) or less by measurement with a helium leakage detector.

Furthermore, the inventors have also found that, in this case, the helium leakage quantity and breakdown voltage at the time of raising temperature have a correlation. Thus, the present invention has been made.

That is, the present invention is a hot plate comprising: a ceramic substrate; and a resistance heating element formed on the surface of the ceramic substrate or inside the ceramic substrate, wherein the ceramic substrate has a leakage quantity of $10^{-7}$ Pa·m$^3$/sec (He) or less by measurement with a helium leakage detector.

In the hot plate of the present invention, the leakage quantity thereof is $10^{-7}$ Pa·m$^3$/sec (He) or less by measurement with a helium leakage detector. When the leakage quantity is in such a degree, the ceramic substrate mentioned above is sufficiently densely sintered. Thus, the ceramic substrate can give a thermal conductivity of 150 W/m·k or more. Therefore, the ceramic substrate mentioned above has excellent temperature-rising/dropping property. Additionally, at the time of cooling, a gas as a coolant does not permeate the ceramic substrate; therefore, the ceramic substrate has high cooling thermal efficiency and particularly has superior temperature-dropping property.

Since the above-mentioned ceramic substrate is superior in mechanical property, no warp is generated in the ceramic substrate and the ceramic substrate is also superior in breakdown voltage and Young's modules at a high temperature.

In the case of measuring the above-mentioned leakage quantity, the same sample as the above-mentioned ceramic substrate is prepared to have a diameter of 30 mm, an area of 706.5 mm$^2$ and a thickness of 1 mm, and set in a helium leakage detector. Thereafter, the leakage quantity of the above-mentioned ceramic substrate can be measured by measuring a flow amount of helium passing through the above-mentioned sample.

The helium leakage detector measures the partial pressure of helium at the time of leakage but does not measure the absolute value of the gas flow amount. The helium partial pressure values of the samples of which the leakage quantities are known are measured in advance, and unknown leakage quantity is calculated by simple proportional calculation on the basis of the helium partial pressure detected at the measurement. The detailed measurement principle of the helium leakage detector is described in a monthly journal, "Semiconductor World 1992, November, p. 112 to 115".

That is, if the above-mentioned ceramic substrate is sufficiently densely sintered, the above-mentioned leakage quantity is a considerably small value. On the other hand, if the sinterability of the above-mentioned ceramic substrate is insufficient, the above-mentioned leakage quantity becomes a large value.

In the present invention, for example, by conducting the process of: oxidizing the surface of particles of a non-oxide ceramic such as a nitride ceramic at first; successively adding an oxide thereto; and carrying out sintering under pressure, a sintered body in which an oxide layer of the nitride ceramic and the like is integrated with the added oxide is formed. Such a sintered body has an extremely small leakage quantity of $10^{-7}$ Pa·m$^3$/sec (He) or less in the measurement with the helium leakage detector.

In addition, when the formed body before the sintering is pressed as uniformly as possible by cool isostatic press (CIP), the sintering advances more uniformly and the sintering density is made higher. Thus, the leakage quantity becomes far smaller. The pressure upon the CIP is preferably from 50 to 500 MPa (0.5 to 5 t/cm$^2$).

The leakage quantity is preferably from $1\times10^{-8}$ to $1\times10^{-12}$ Pa·m$^3$/sec (He) by measurement with the helium leakage detector. This is because thermal conductivity at high temperature can be ensured and further cooling thermal efficiency becomes high at the time of cooling.

Incidentally, although aluminum nitride sintered bodies wherein a small amount of ALON crystal phase exists are disclosed in JP Kokai Hei 9-48668, JP Kokai Hei 9-48669, and JP Kokai Hei 10-72260 and so on, no metal oxide is added therein and they are manufactured by reductive nitrogenation method. Therefore, no oxygen exists on the surface and the sinterability is inferior. As shown in the comparative example, a relatively high leakage quantity of about $10^{-6}$ Pa·m$^3$/sec (He) is generated. In JP Kokai Hei 7-153820, although yttria is added, the surface of aluminum nitride raw material powder is not fired in advance. Thus, as is also clear from the comparative example, the sinterability thereof is inferior, and a relatively large leakage quantity such as about $10^{-6}$ Pa·m$^3$/sec (He) is generated. In addition, in JP Kokai Hei 10-279359, firing is performed under low temperature and atmospheric pressure, thus the leakage quantity becomes high as well. In JP Kokai Hei 10-158002 discloses an AlN substrate used for a substrate on which a semiconductor is mounted but not for a semiconductor producing/examining device, unlike the present invention. Furthermore, in JP Kokai Hei 10-167859, since the amount of yttria is as small as 0.2% by weight and sinterability is insufficient, the leakage quantity becomes high.

As described above, any conventional technique has not yet realized a semiconductor producing/examining device using a sintered body whose helium leakage quantity can be adjusted to $1\times10^{-7}$ Pa·m$^3$/sec (He) or less just like the one in the present invention.

Theses citations neither describe nor suggest any isotropic press such as cool isostatic press (CIP). Thus, the helium leakage quantity thereof has not yet been reduced.

The oxide to be added is preferably an oxide of an element which constitutes a nitride ceramic and the like. This is because the oxide is the same material as the surface oxide layer of the nitride ceramic and is very easily sintered together. In order to oxidize the surface of the nitride ceramic, it is desired to heat the nitride ceramic at 500 to 1000° C. in oxygen or the air for 0.5 to 3 hours.

The average particle diameter of the nitride ceramic powder used in the sintering is preferably from about 0.1 to 5 μm. This is because the powder is easily sintered.

Furthermore, it is desired that the ceramic powder contains 0.05 to 50 ppm (by weight) of Si and 0.05 to 80 ppm (by weight) of S. This is because these would cause the oxidized film on the surface of the nitride ceramic to be combined with the added oxide.

Other firing conditions will be described in detail in a later-described process for manufacturing a hot plate.

The ceramic substrate obtained by using the above-mentioned process to perform sintering desirably contains 0.05 to 10% by weight of oxygen. If the amount is less than 0.05% by weight, the sintering does not advance so that fracture is caused in the grain boundary and the thermal conductivity drops. On the other hand, if the oxygen amount is more than 10% by weight, the oxygen is unevenly precipitated in the grain boundary so that fracture is caused at the grain boundary. Thus, the thermal conductivity drops so that the temperature-rising/dropping property deteriorates.

In the present invention, it is desired that the ceramic substrate constituting the hot plate comprises a nitride ceramic containing oxygen and further the pore diameter of the maximum pore is 50 μm or less. The porosity thereof is desirably 5% or less. It is also desirable that no pores are present in the ceramic substrate mentioned above or, if present, the pore diameter of the maximum pore is 50 μm or less.

If no pores are present, breakdown voltage is especially high at high temperature. Conversely, if pores are present, fracture toughness becomes high. Thus, which is designed depends on required properties.

The reason why fracture toughness becomes high on the basis of the presence of pores is unclear, but it is presumed that the reason is based on stop of development of cracks by the pores.

The reasons why the pore diameter of the maximum pore is desirably 50 μm or less in the present invention are as follows: if the pore diameter is over 50 μm, it is difficult to keep high breakdown voltage property at high temperature, particularly at 200° C. or higher; and gas is easily released at the time of cooling, so that cooling thermal efficiency deteriorates.

The pore diameter of the maximum pore is desirably 10 μm or less. This is because the amount of warp becomes small at 200° C. or higher.

The porosity and the pore diameter of the maximum pore are adjusted by pressing time, pressure and temperature at the time of sintering, or additives such as SiC and BN. Since SiC or BN obstructs sintering, pores can be produced.

When the pore diameter of the maximum pore is measured, 5 samples are prepared. The surfaces thereof are ground into mirror planes. With an electron microscope, ten points on the surface are photographed with 2000–5000 magnifications. The maximum pore diameter is selected from the each photograph obtained by the photographing, and the average of the 50 shoots is defined as the pore diameter of the maximum pore.

The porosity is measured by Archimedes' method. This is a method of crushing a sintered body to pieces, putting the pieces into an organic solvent or mercury to measure the volume thereof, then, obtaining the true specific gravity of the pieces from the weight and the volume thereof, and calculating the porosity from the true specific gravity and apparent specific gravity.

The diameter of the ceramic substrate constituting the hot plate of the present invention is desirably 200 mm or more. It is especially desirable that the diameter is 12 inches (300 mm) or more. This is because semiconductor wafers having such a diameter become main currents of the next-generation semiconductor wafers. This is also because the problem about the warp to be solved by the present invention is not easily caused in the ceramic substrate having a diameter of 200 mm or less.

The thickness of the above-mentioned ceramic substrate is desirably 50 mm or less, especially desirably 25 mm or less.

This is because: if the thickness of the ceramic substrate is over 25 mm, the thermal capacity of the ceramic substrate maybe too large; and particularly when a temperature-controlling means is set up to heat or cool the substrate, temperature following character may drop on the basis of the large thermal capacity.

This is also because the problem about the warp of the ceramic substrate is not easily caused in the ceramic substrate having a large thickness, such as a thickness over 25 mm.

The thickness of the ceramic substrate is optimally 5 mm or less. The thickness of the ceramic substrate is desirably 1 mm or more.

The ceramic substrate of the present invention is used at 150° C. or higher, desirably 200° C. or higher.

The material of the ceramic substrate constituting the hot plate of the present invention is not especially limited. However, nitride ceramics and carbide ceramics are preferred. Examples of the nitride ceramics mentioned above include metal nitride ceramics such as aluminum nitride, silicon nitride, boron nitride, titanium nitride and the like.

Examples of the carbide ceramics mentioned above include such as silicon carbide, titanium carbide, tantalum carbide, tungsten carbide, zirconium carbide and the like.

As the above-mentioned ceramic material, an oxide ceramic may be used. Examples of the oxide ceramic mentioned above include metal oxide ceramics such as alumina, zirconia, cordierite, mullite and the like.

Aluminum nitride is particularly preferred among these nitride ceramics since its thermal conductivity is highest, that is, 180 W/m·K.

In the present invention, it is desired that the ceramic substrate contains an oxide.

As the oxide mentioned above, for example, an alkali metal oxide, an alkali earth metal oxide or a rare earth oxide can be used. Among these sintering aids, CaO, $Y_2O_3$, $Na_2O$, $Li_2O$ and $Rb_2O$ are particularly preferred. Alumina or silica may be used. The content thereof is desirably from 0.5 to 20% by weight. If the content is less than 0.5% by weight, the leakage quantity may not be made to $10^{-7}$ Pa m$^3$/sec (He) or less.

The added oxide is optimally silica in the case of silicon nitride.

In the present invention, the ceramic substrate preferably contains 5 to 5000 ppm of carbon. The ceramic substrate can be blackened by incorporating carbon. This is because, when the substrate is used as a heater, radiant heat can be sufficiently used.

Carbon may be amorphous or crystalline. When amorphous carbon is used, a drop in the volume resistivity at high temperature can be prevented. When crystalline carbon is used, a drop in the thermal conductivity at high temperature can be prevented. Therefore, crystalline carbon and amorphous carbon may be used together dependently on use. The carbon content is preferably from 50 to 2000 ppm.

When carbon is incorporated into the ceramic substrate mentioned above, carbon is preferably incorporated in the manner that its brightness will be N4 or less as a value based on the rule of JIS Z 8721. The ceramic having such a brightness is superior in radiant heat capacity and shielding property.

The brightness N is defined as follows: the brightness of ideal black is made to 0; that of ideal white is made to 10; respective colors are divided into 10 parts in the manner that the brightness of the respective colors is recognized stepwise between the brightness of black and that of white at equal intensity intervals; and the resultant parts are indicated by symbols N0 to N10, respectively.

Actual brightness is measured by comparison with color chips corresponding to N0 to N10. One place of decimals in this case is made to 0 or 5.

| Description of Reference Numbers | |
|---|---|
| 9 | silicon wafer |
| 10, 20 | hot plate |
| 11, 21 | ceramic substrate |
| 12, 22 | resistance heating element |
| 13, 23 | external terminal |
| 14 | bottomed hole |
| 15 | through hole |
| 16 | lifter pins |
| 18 | thermocouple |
| 25 | through hole |
| 27 | blind hole |
| 28 | conductor-filled through hole |
| 30 | supporting case |
| 30a | collant outlet |
| 32 | guide pipe |
| 35 | heat insulator |
| 37 | pressing metal member |
| 38 | bolt |
| 39 | collant inlet pipe |
| 130 | solder paste layer |
| 170 | socket |

DISCLOSURE OF THE INVENTION

The hot plate of the present invention is a hot plate comprising: a ceramic substrate; and a resistance heating element formed on the surface of the ceramic substrate or inside the ceramic substrate, wherein the ceramic substrate has a leakage quantity of $10^{-7}$ Pa·m$^3$/sec (He) or less by measurement with a helium leakage detector.

Figure 1:
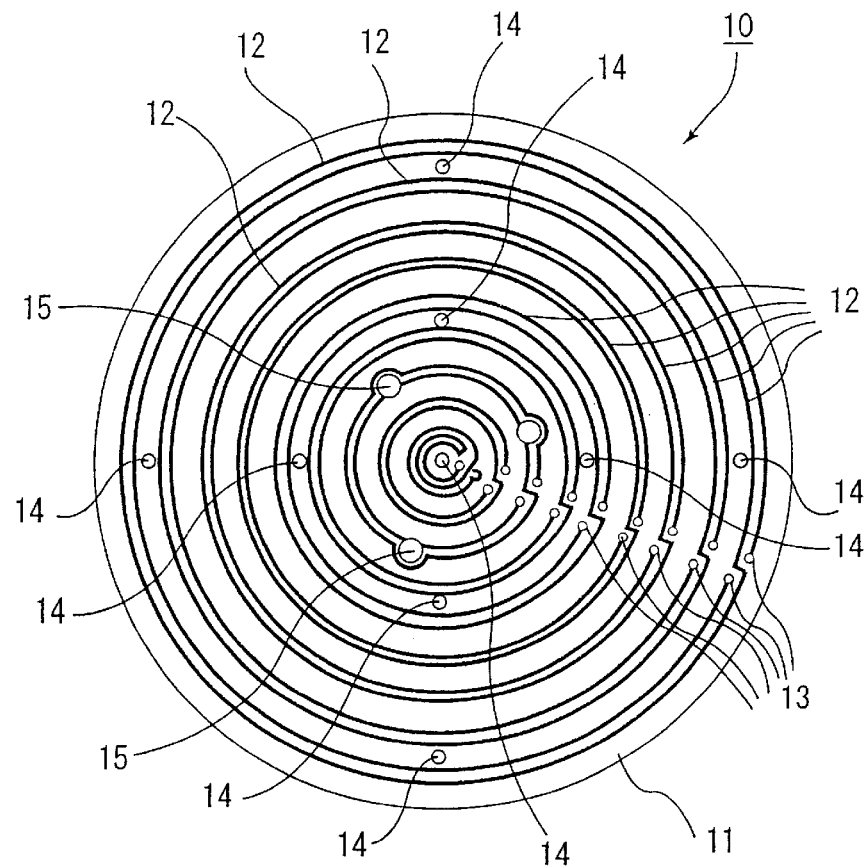
FIG. 1 is a bottom view schematically illustrating an example of a hot plate of the present invention wherein resistance heating elements are formed on the bottom face thereof.
Figure 2:
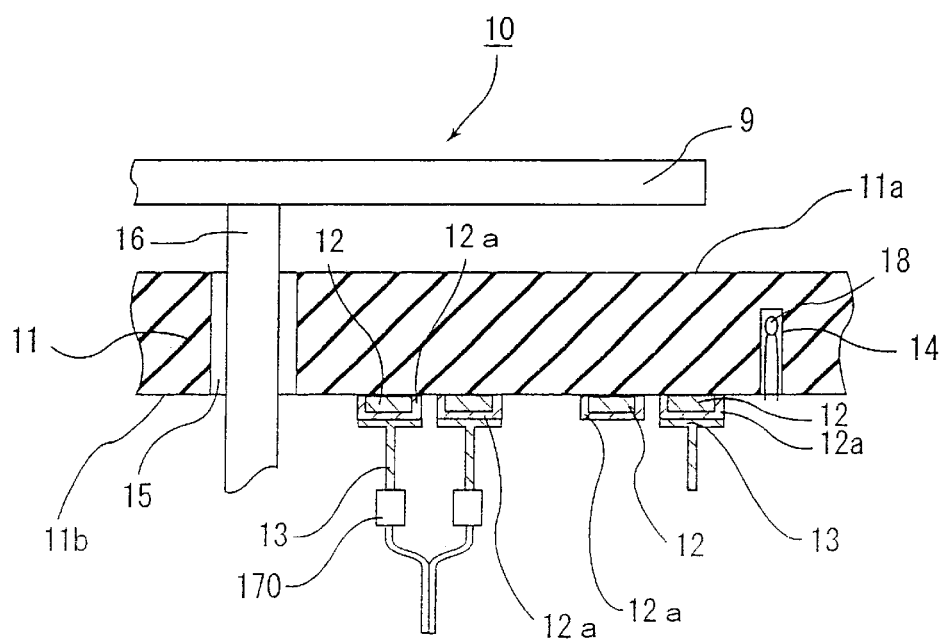
FIG. 2 is a partially-enlarged sectional view schematically illustrating a part of the hot plate illustrated in FIG. 1.

FIG. 1 is a bottom view schematically illustrating an example of the hot plate of the present invention, and FIG. 2 is a partially-enlarged sectional view schematically illustrating a part of the hot plate illustrated in FIG. 1. In this hot plate, resistance heating elements are formed on the bottom face of a ceramic substrate.

As illustrated in FIG. 1, the ceramic substrate 11 is formed in a disc form. Plural resistance heating elements 12 having the form of concentric circles-like are made on a bottom face 11b of the ceramic substrate 11. About these resistance heating elements 12, two concentric circles near to each other are combined to produce one line as a circuit. These circuits are designed to be combined with each other to make the temperature in a heating face 11a even.

As illustrated in FIG. 2, a metal covering layer 12a is formed on the resistance heating elements 12 to prevent them from being oxidized. External terminals 13 are jointed to both ends thereof with solder and the like (not illustrated)

Sockets 170 having wiring are fitted to the external terminals 13, so as to attain connection to a power source.

In the ceramic substrate 11, bottomed holes 14 for inserting temperature-measuring elements 18 are made, and the temperature-measuring elements 18 such as thermocouples are embedded in the bottomed holes 14. Moreover, through holes 15 for penetrating lifter pins 16 through are made in portions near the center thereof.

The lifter pins 16, on which a silicon wafer 9 can be put, can be moved up and down. In this way, the silicon wafer 9 can be delivered to a non-illustrated carrier machine or the silicon wafer 9 can be received from the carrier machine. Additionally, the silicon wafer 9 can be put on the heating face 11a of the ceramic substrate 11 and be heated, or the silicon wafer 9 can be supported in the state that the wafer 9 is 50 to 2000 $\mu$m apart from the heating face 11a and be heated.

It is allowable to make through holes or concave portions in the ceramic substrate 11, insert supporting pins whose tips are in a pointed end form or semicircular form into the through holes or the concave portions, fix the supporting pins in the state that the pins are slightly projected from the ceramic substrate 11, and support the silicon wafer 9 by the supporting pins, thereby heating the silicon wafer in the state that the silicon wafer is 50 to 2000 $\mu$m apart from the heating face 11a.

Figure 3:
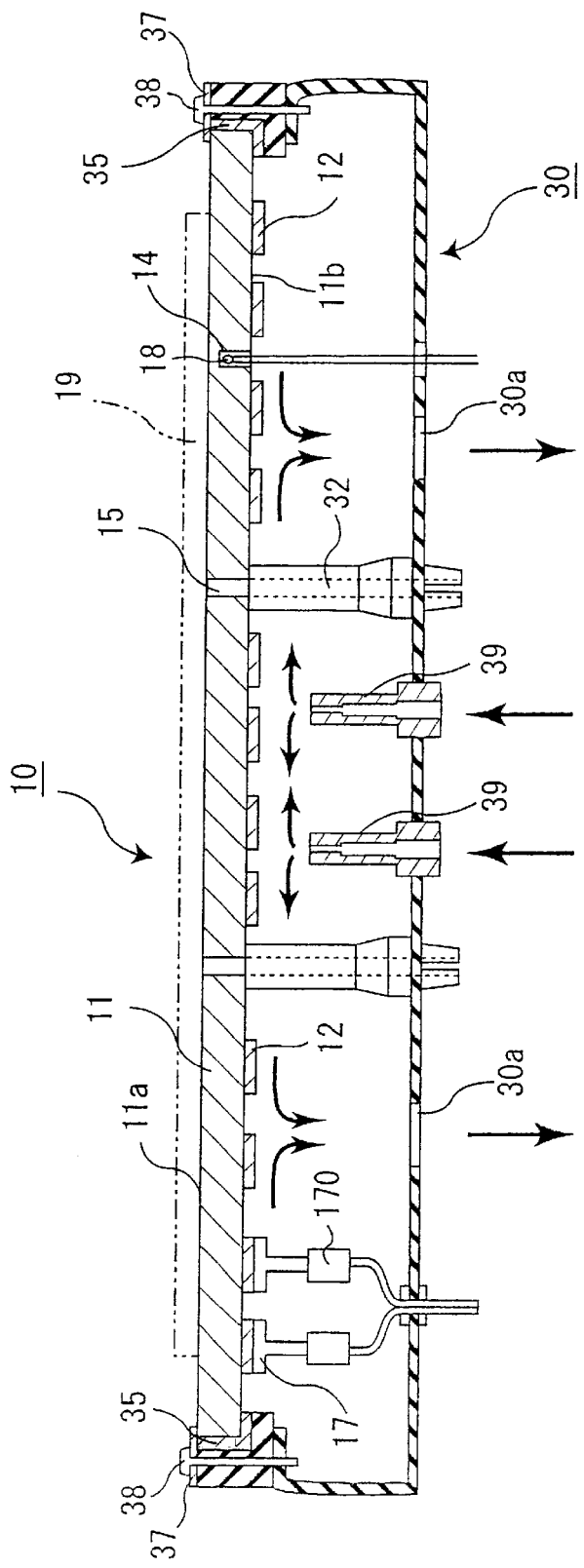
FIG. 3 is a sectional view schematically illustrating a supporting case for arranging the hot plate illustrated in FIG. 1.

FIG. 3 is a sectional view schematically illustrating a supporting case 30 for arranging the hot plate (ceramic substrate) having the above-mentioned structure.

The ceramic substrate 11 is fitted through a heat insulator 35 to the upper portion of the supporting case 30, and is fixed thereto with bolts 38 and pressing metal members 37. In portions where through holes 15 of the ceramic substrate 11 are made, guide pipes 32 are made so as to be interconnected with the through holes. Furthermore, coolant outlets 30a are made in this supporting case 31. A coolant is blown from coolant inlet pipe 39 thereto, passed through the coolant outlets 30a, and discharged to the outside. By the effect of this coolant, the ceramic substrate 11 can be cooled.

Accordingly, an electric current is sent to the hot plate to raise the temperature of the hot plate 10 up to a given temperature. Thereafter, the coolant is blown from the coolant inlet pipes 39 so as to cool the ceramic substrate 11. In the hot plate of the present invention, the leakage quantity thereof is as small as $10^{-7}$ Pa·m$^3$/sec (He) or less by measurement with a helium leakage detector; therefore, the ceramic substrate 11 can be effectively cooled.

Figure 4:
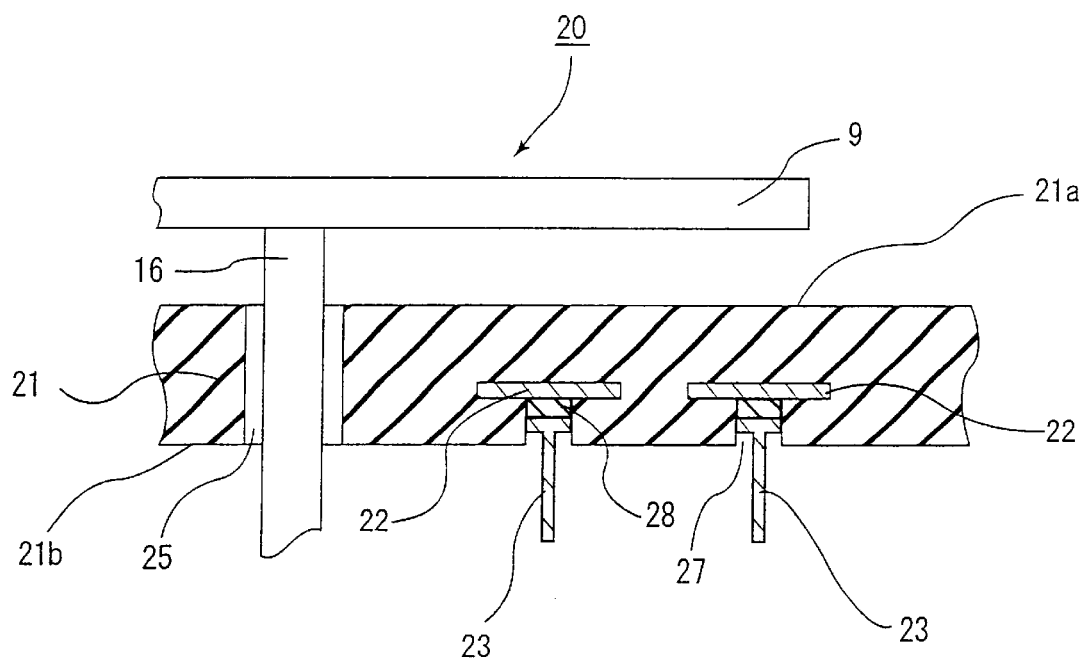
FIG. 4 is a partially-enlarged sectional view schematically illustrating an example of a hot plate of the present invention having resistance heating elements formed inside thereof.

FIG. 4 is a partially-enlarged sectional view schematically illustrating another example of the hot plate of the present invention. In this hot plate, resistance heating elements are formed inside a ceramic substrate.

Although not shown, in the same way as in the hot plate illustrated in FIG. 1, the ceramic substrate 21 is formed in a disc form, and the resistance heating elements 22 are formed inside the ceramic substrate 21 to have the same pattern as illustrated in FIG. 1, that is, a pattern having a concentric circles-like shape, wherein double concentric circles near to each other are made up to one circuit.

Conductor-filled through holes 28 are made just under end portions of the resistance heating elements 22. Moreover, blind holes 27 for making the conductor-filled through holes 28 exposed are made in a bottom face 21b, and external terminals 23 are inserted to the blind holes 27. They are jointed to each other with a brazing material and the like (not illustrated).

In the same way as in the hot plate illustrated in FIG. 1, for example, sockets having conductive wires are fitted to the external terminals 23. This situation is not illustrated in FIG. 3. The conductive wires are connected to a power source and so on.

In the ceramic substrate 21 constituting this hot plate, the leakage quantity thereof is as small as $10^{-7}$ Pa·m$^3$/sec (He) or less by measurement with a helium leakage detector; therefore, the ceramic substrate 21 is sufficiently densely sintered. For this reason, when this hot plate is fitted to the supporting case 30 as illustrated in FIG. 3 and then temperature-rising/dropping operation of the ceramic substrate is performed, temperature-rising/dropping can be promptly attained.

Inside the ceramic substrate constituting the hot plate of the present invention, the resistance heating elements composed of plural layers may be set. In this case, the patterns of the respective layers may be formed to complement themselves mutually. The pattern, when being viewed from the top of the heating face, is desirably formed on any of the layers. For example, a structure having a staggered arrangement is desirable.

Examples of the resistance heating element include a sintered body of a metal or an electrically conductive ceramic; a metal foil; a metal wire and the like. As the metal sintered body, at least one selected from tungsten and molybdenum is preferred. This is because these metals are not relatively liable to be oxidized and have a sufficiently large resistance value to generate heat.

As the electrically conductive ceramic, at least one selected from carbides of tungsten and molybdenum may be used.

In the case that the resistance heating element is formed on the bottom face of the ceramic substrate, it is desired to use, as the metal sintered body, a noble metal (gold, silver, palladium or platinum), or nickel. Specifically, silver, silver-palladium and the like may be used.

As the metal particles used in the metal sintered body mentioned above, spherical or scaly particles, or a mixture of spherical particles and scaly particles can be used.

When the resistance heating element is formed on the surface of the ceramic substrate, a metal oxide may be added to the metal and the resultant is sintered. The metal oxide mentioned above is used in order to adhere the ceramic substrate closely to particles of the metal. The reason why the adhesion between the ceramic substrate and the metal particles is improved by the metal oxide mentioned above is unclear, but an oxide film is slightly formed on the surface of the metal particles and an oxide film is formed on the surface of the ceramic substrate in the case that the ceramic substrate is made of a non-oxide ceramic as well as an oxide. Thus, it can be therefore considered that these oxide films are sintered and integrated with each other, through the metal oxide, on the surface of the ceramic substrate so that the metal particles and the ceramic substrate adhere closely to each other.

A preferred example of the above-mentioned metal oxide is at least one selected from lead oxide, zinc oxide, silica, boron oxide ($B_2O_3$), alumina, yttria, and titania. These oxides make it possible to improve adhesiveness between the metal particles and the ceramic substrate without increasing the resistance value of the resistance heating element too much.

The amount of the above-mentioned metal oxide is desirably 0.1 part by weight or more and is below 10 parts by weight per 100 parts by weight of the metal particles. The use of the metal oxide within this range makes it possible to improve the adhesion between the metal particles and the ceramic substrate without making the resistance value too large.

When the total amount of the metal oxides is set to 100 parts by weight, the weight ratio of lead oxide, zinc oxide, silica, boron oxide ($B_2O_3$), alumina, yttria and titania is as follows: lead oxide: 1 to 10, silica: 1 to 30, boron oxide: 5 to 50, zinc oxide: 20 to 70, alumina: 1 to 10, yttria: 1 to 50 and titania: 1 to 50. The ratio is preferably adjusted within the scope that the total amount of these oxides is not over 100 parts by weight. This is because these ranges especially improve adhesiveness to the ceramic substrate.

In the case that the resistance heating element is set up on the bottom face of the ceramic substrate, the surface of the resistance heating element 12 is desirably covered with a metal layer 12a (reference to FIG. 2). The resistance heating element 12 is a sintered body of the metal particles. Thus, when the resistance heating element is exposed, it is easily oxidized. The oxidization causes a change in the resistance value. Thus, by covering the surface with the metal layer 12a, the oxidization can be prevented.

The thickness of the metal layer 12a is desirably 0.1 to 100 μm. This range is a range making it possible to prevent the oxidization of the resistance heating element without changing the resistance value of the resistance heating element too much.

The metal used for the covering is any non-oxidizable metal. Specifically, at least one or more selected from gold, silver, palladium, platinum and nickel is preferred. Among these metals, nickel is more preferred. The resistance heating element needs to have a terminal for connection to a power source. This terminal is attached to the resistance heating element through solder. Nickel prevents thermal diffusion of the solder. As the connecting terminal, an external terminal made of Kovar can be used.

In the case that the resistance heating element is formed inside the ceramic substrate, the surface of the resistance heating element is not oxidized. Therefore, no covering is necessary. In the case that the resistance heating element is inside the heater plate, a part of the surface of the resistance heating element may be exposed.

As the resistance heating element, a metal foil or a metal wire may be used. As the metal foil mentioned above, a resistance heating element patterned by the etching of a nickel foil or a stainless steel foil and the like method is desirable. The patterned metal foils may be put together with a resin film and the like. Examples of the metal wire include a tungsten wire, a molybdenum wire and the like.

Temperature-controlling means may be a Peltier device as well as the resistance heating elements 12. In the case that the Peltier device is used as the temperature control element, both of heating and cooling can be attained by changing the direction along which an electric current passes. Thus, this case is advantageous.

The Peltier device is formed by connecting p type and n type thermoelectric elements in series and then jointing the resultant to a ceramic plate and the like.

Examples of the Peltier device include silicon/germanium type, bismuth/antimony type, and lead/tellurium type materials.

If necessary, in the present invention a thermocouple may be buried in a bottomed hole in the ceramic substrate. This is because the thermocouple makes it possible to measure the temperature of the resistance heating element and, on the basis of the resultant data, voltage or electric current is changed so that the temperature can be controlled.

It is preferable that the size of the connecting portion of metal wires of the thermocouple is the same as the strand diameter of the respective metal wires or more, and is 0.5 mm or less. Such a structure makes the thermal capacity of the connecting portion small, and causes a temperature to be correctly and speedy converted to a current value. For this reason; temperature control ability is improved so that the temperature distribution of the heated surface of the wafer becomes small.

Examples of the thermocouple mentioned above include K, R, B, S, E, J and T type thermocouples, described in JIS-C-1602 (1980).

The following will describe a process for manufacturing the hot plate of the present invention.

FIGS. 5(a) to (d) are sectional views schematically illustrating a process for manufacturing a hot plate having resistance heating elements on the bottom face of a ceramic substrate.

(1) Step of manufacturing the ceramic substrate

Ceramic powder of the above-mentioned aluminum nitride and the like are blended with, based on the necessity, a sintering aid such as yttria, a binder and so on to prepare a slurry. Thereafter, this slurry is made into a granular form by spray-drying and the like. The granule is put into a mold and pressed to be formed into a plate form and the like form. Thus, a raw formed body (green) is formed. When the slurry is prepared, amorphous or crystalline carbon may be added.

Next, this formed body is heated and fired to be sintered. In this way, a plate formed body made of the ceramic is manufactured. Thereafter, the plate formed body is worked into a given shape to manufacture a ceramic substrate 11. The formed body may have such a shape that the body can be used as it is after the firing. In addition, by using cool isostatic press (CIP) to compress the formed body, sintering advances uniformly so that the sintering density can be improved. As the pressure upon the CIP, a pressure of 50 to 500 MPa (0.5 to 5 t/cm$^2$) is preferred (FIG. 5(a)). By heating and firing the formed body while pressurizing the body, the ceramic substrate 11 having no pores can be manufactured. The heating and the firing should be performed at the sintering temperature or higher. For a nitride ceramic, the temperature is from 1000 to 2500° C.

Next, the following portions are made in the ceramic substrate 11 if necessary: through holes for inserting supporting pins supporting a silicon wafer; through holes 15 for inserting lifter pins carrying the silicon wafer; bottomed holes 14 for embedding temperature-measuring elements such as thermocouples; and so on.

(2) Step of printing a conductor containing paste on the ceramic substrate

A conductor containing paste is generally a fluid comprising metal particles, a resin and a solvent, and has a high viscosity. This conductor containing paste is printed in portions where resistance heating elements are to be arranged by screen printing and the like, to form a conductor containing paste layer. Since it is necessary that the resistance heating elements make the temperature of the whole of the ceramic substrate even, it is preferable that the conductor containing paste is made into the form of concentric circles-like, or is printed into a pattern wherein a concentric circles-like form and a bending line form are combined with each other.

The conductor containing paste layer is preferably formed in such a manner that a section of the resistance heating elements 12 subjected to the firing will be rectangular and flat.

(3) Firing of the conductor containing paste

The conductor containing paste layer printed on the bottom face of the ceramic substrate 11 is heated or fired to remove the resin and the solvent and sinter the metal particles. Thus, the metal particles are baked onto the bottom face of the ceramic substrate 11 to form the resistance heating elements 12 (FIG. 5(b)). The heating and firing temperature is preferably from 500 to 1000° C.

If the above-mentioned oxide is added to the conductor containing paste, the metal particles, the ceramic substrate and the metal oxide are sintered to be integrated with each other. Thus, the adhesiveness between the resistance heating elements and the ceramic substrate is improved.

(4) Step of forming a metal covering layer

Next, a metal covering layer 12a is deposited on the surface of the resistance heating elements 12 (reference to FIG. 5(c)). The metal covering layer 12a can be formed by electroplating, electroless plating, sputtering and the like. From the viewpoint of mass-productivity, electroless plating is optimal.

(5) Fitting of terminals and so on

External terminals 13 for connection to a power source are fitted up, through a solder paste layer 130, to ends of the circuits of the resistance heating elements 12 (FIG. 5(d)). Thereafter, temperature-measuring elements 18 such as thermocouples are embedded in the bottomed holes 14, and the holes are sealed with a heat-resistant resin such as polyimide and the like. For example, sockets having conductive wires and so on are fitted to the external terminals 13 so that the sockets can be put on and taken off. This situation is not illustrated.

(6) Thereafter, the ceramic substrate having these resistance heating elements 12 is fitted to, for example, a supporting case having a cylindrical shape, and the lead wires extending from the sockets are connected to a power source. In this way, the manufacture of a hot plate is finished.

An electrostatic chuck can be manufactured by setting an electrostatic electrode inside the ceramic substrate when the above-mentioned hot plate is manufactured. A wafer prober can be manufactured by depositing a chuck top conductor layer on the heating face and then setting guard electrodes and ground electrodes inside the ceramic substrate.

In the case that the electrode is set inside the ceramic substrate, it is advisable that metal foil and the like is embedded in the ceramic substrate. In the case that the conductor layer is formed on the surface of the ceramic substrate, sputtering or plating may be used. These may be used together.

The following will describe a process for manufacturing a hot plate having resistance heating elements inside the ceramic substrate of the present invention.

FIGS. 6(a) to (d) are sectional views schematically illustrating the manufacturing process of the above-mentioned hot plate.

(1) Step of forming green sheets

First, powder of a nitride ceramic is mixed with a binder, a solvent and so on, to prepare a paste. This is used to form a green sheet.

As the above-mentioned ceramic powder, aluminum nitride, and the like can be used. If necessary, a sintering aid such as yttria may be added. When the green sheet is formed, crystalline or amorphous carbon may be added.

As the binder, desirable is at least one selected from an acrylic binder, ethylcellulose, butylcellosolve, and polyvinyl alcohol.

As the solvent, desirable is at least one selected from α-terpineol and glycol.

A paste obtained by mixing these is formed into a sheet form by doctor blade process, to form a green sheet 50.

The thickness of the green sheet 50 is preferably from 0.1 to 5 mm.

Next, the following are made in the resultant green sheet if necessary: portions for through holes for inserting supporting pins supporting a silicon wafer; portions for through holes 25 for inserting lifter pins carrying the silicon wafer; portions for bottomed holes 24 for embedding temperature-measuring elements such as thermocouples; portions for embedding conductor-filled through holes 28 for connecting the resistance heating elements to external terminals; and so on. After a green sheet lamination that will be described later is formed, the above-mentioned processing may be performed.

(2) Step of printing a conductor containing paste on the green sheet

A metal paste or a conductor containing paste containing an electrically conductive ceramic is printed on the green sheet 50, to form a conductor containing paste layer 220. The conductor containing paste is filled into the portion which will be the conductor-filled through holes 28, so as to prepare a filled layer 280.

This conductor containing paste contains metal particles or electrically conductive ceramic particles.

The average particle diameter of tungsten particles or molybdenum particles, which are the metal particles, is preferably from 0.1 to 5 $\mu$m. If the average particle is below 0.1 $\mu$m or over 5 $\mu$m, the conductor containing paste is not easily printed.

Such a conductor containing paste may be a composition (paste) obtained by mixing, for example, 85 to 87 parts by weight of the metal particles or the electrically conductive ceramic particles; 1.5 to 10 parts by weight of at least one binder selected from acrylic binders, ethylcellulose, butylcellosolve and polyvinyl alcohol; and 1.5 to 10 parts by weight of at least one solvent selected from α-terpineol and glycol.

(3) Step of laminating the green sheets

Green sheets 50 on which the conductor containing paste produced in the above-mentioned step (1) is not printed are laminated on the upper and lower sides of the green sheet 50 on which the conductor containing paste produced in the above-mentioned step (2) is printed (FIG. 6(a)).

At this time, the number of the green sheets laminated on the upper side is made larger than that of the green sheets laminated on the lower side to cause the position where the resistance heating elements 22 are formed to be prejudiced toward the bottom face.

Specifically, the number of the green sheets laminated on the upper side is preferably from 20 to 50, and that of the green sheets laminated on the lower side is preferably from 5 to 20.

(4) Step of firing the green sheet lamination

The green sheet lamination is heated and pressed and further the lamination is pre-sintered at 300 to 1000° C. Thereafter, cool isostatic press (CIP) is used to compress the lamination. In this way, dispersion in the thermal conductivity, resulting from difference in the sintering density, can be reduced. The pressure upon the CIP is preferably from 50 to 500 MPa(0.5 to 5 t/cm$^2$). As described above, the green sheets 50 and the conductor containing paste inside it are sintered to manufacture a ceramic substrate 21.

The heating temperature is preferably from 1000 to 2000° C., and the pressing pressure is preferably from 10 to 20 MPa. The heating is performed in the atmosphere of an inert gas. As the inert gas, for example, argon or nitrogen can be used.

Through holes 25 for penetrating lifters pins through and bottomed holes 24 for inserting temperature-measuring elements, are made in the resultant ceramic substrate 21 (FIG. 6(b)), and subsequently blind holes 27 for making conductor-filled through holes 28 exposed are made (FIG. 6(c)) The through holes 25, the bottomed holes 24 and the blind holes 27 can be made by drilling or blast treatment such as sandblast.

Next, brazing gold and the like is used to connect external terminals 23 to the conductor-filled through holes exposed from the blind holes 27 (FIG. 6(d). Furthermore, for example, sockets having conductive wires, which are not illustrated, are fitted to the external terminals 23 so that the sockets can be put on and taken off.

The heating temperature is suitably from 90 to 450° C. in the case of treatment with solder. The heating temperature is suitably from 900 to 1100° C. in the case of treatment with brazing material. Furthermore, thermocouples and the like as the temperature-measuring elements are sealed with a heat-resistant resin to manufacture a hot plate.

(5) Thereafter, the ceramic substrate 21 having therein the resistance heating elements 22 in this way is fitted to a supporting case having a cylindrical shape, and then the lead wires extending from the sockets are connected to a power source, to finish the manufacture of the hot plate.

In the above-mentioned hot plate, various operations can be performed while a silicon wafer and the like is being heated or cooled, after the silicon wafer and the like is put thereon or after the silicon wafer and the like is held by supporting pins.

An electrostatic chuck can be manufactured by setting an electrostatic electrode inside the ceramic substrate when the above-mentioned hot plate is manufactured. A wafer prober can be manufactured by depositing a chuck top conductor layer on the heating face and then setting guard electrodes and ground electrodes inside the ceramic substrate.

In the case that the electrode is set inside the ceramic substrate, it is advisable that a conductor containing paste layer is formed on the surface of the green sheet in the same manner as in the case of forming the resistance heating elements. In the case that the conductor containing paste is formed on the surface of the ceramic substrate, sputtering or plating may be used. These may be used together.

BEST MODE FOR CARRYING OUT THE INVENTION

The present invention will be described in more detail hereinafter.

EXAMPLES 1 to 7

Figure 6:
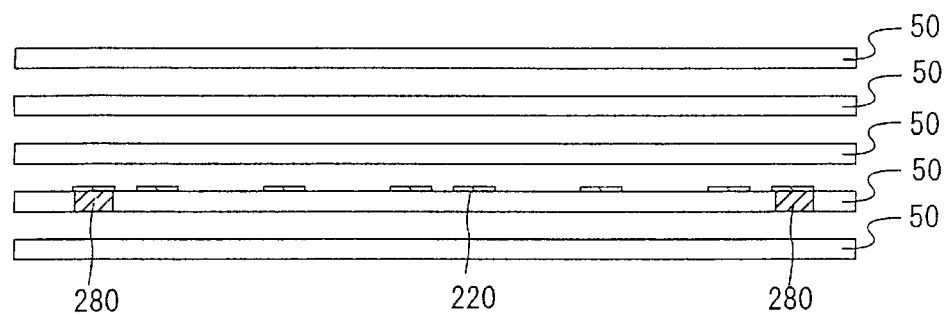
FIGS. 6(a) to (d) are sectional views schematically illustrating parts of the process for manufacturing a hot plate of the present invention having resistance heating elements formed inside thereof.
Figure 6:
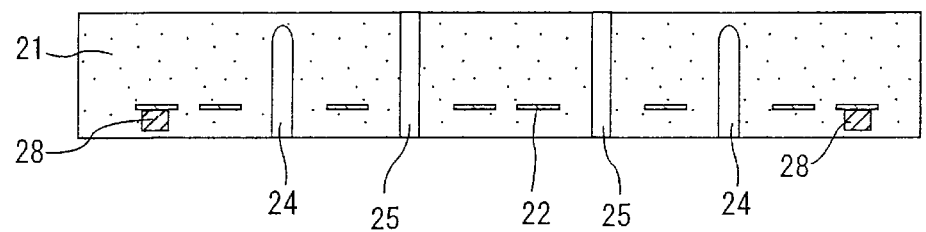
Figure 6:
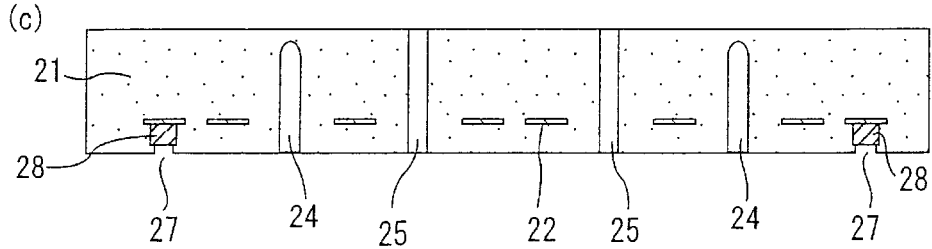
Figure 6:
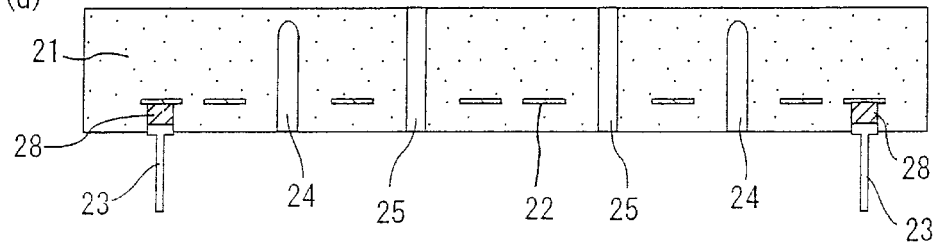

Manufacture of Hot Plates (Reference to FIG. 6)

(1) The following paste was used to conduct formation by a doctor blade method to obtain a green sheet 0.47 mm in thickness: a paste obtained by mixing 1000 parts by weight of aluminum nitride powder (made by Tokuyama Corp., average particle diameter: 0.6 $\mu$m) fired at 500° C. in the air for 1 hour, 40 parts by weight of yttria (average particle diameter: 0.4 $\mu$m), 115 parts by weight of an acrylic binder, 5 parts by weight of a dispersant and 530 parts by weight of alcohols composed of 1-butanol and ethanol.

(2) Next, this green sheet was dried at 80° C. for 5 hours, and subsequently portions for conductor-filled through holes for connection to external terminals 1.8 mm, 3.0 mm and 5.0 mm in diameter were made by punching.

(3) The following were mixed to prepare a conductor containing paste A: 100 parts by weight of tungsten carbide particles having an average particle diameter of 1 $\mu$m, 3.0 parts by weight of an acrylic binder, 3.5 parts by weight of $\alpha$-terpineol solvent, and 0.3 part by weight of a dispersant.

The following were mixed to prepare a conductor containing paste B: 100 parts by weight of tungsten particles having an average particle diameter of 3 $\mu$m, 1.9 parts by weight of an acrylic binder, 3.7 parts by weight of $\alpha$-terpineol solvent, and 0.2 part by weight of a dispersant.

This conductor containing paste A was printed on the green sheet 50 by screen printing to form a conductor containing paste layer 220 for resistance heating elements 22. The printed pattern was a concentric circles-like pattern as illustrated in FIG. 1. The width of the conductor containing paste was set to 10 mm, and the thickness thereof was set to 12 $\mu$m. The conductor containing paste B was filled into the portions which was to be conductor-filled through holes, so as to make a filled layer 280.

Thirty seven green sheets 50 on which no tungsten paste was printed were stacked on the upper side (heating face) of the green sheet 50 that had been subjected to the above-mentioned processing, and the same thirteen green sheets were stacked on the lower side of the green sheet 50. The resultant was pressed at 130° C. and a pressure of 8 MPa (80 kg/cm$^2$) to form a lamination (FIG. 6(a)).

(4) Next, the resultant lamination was degreased at 600° C. in the atmosphere of nitrogen gas for 5 hours and then compressed at a pressure of 300 MPa (3 t/cm$^2$) by means of a cool isostatic press (CIP) made by Kobe Steel Ltd. Next, the lamination was hot-pressed at 1890° C. and a pressure of 0 to 20 MPa (0 to 200 kgf/cm$^2$) as shown in Table 1, for 3 hours to obtain an aluminum nitride plate 3 mm in thickness. This was cut off into a disc 230 mm in diameter to prepare a ceramic substrate 21 having therein the resistance heating elements 22 having a thickness of 6 $\mu$m and a width of 10 mm (aspect ratio: 1666) and conductor-filled through holes 28 (FIG. 6(b)).

(5) Next, the plate obtained in the (4) was ground with a diamond grindstone. Subsequently a mask was put thereon, and bottomed holes (diameter: 1.2 mm, and depth: 2.0 mm) 24 for thermocouples were made in the surface by blast treatment with SiC and the like.

(6) Furthermore, portions where the conductor-filled through holes were made were hollowed out to make blind holes 27 (FIG. 6(c)). Brazing gold made of Ni—Au was heated and reflowed at 700° C. to connect external terminals 23 made of Kovar to the blind holes 27 (FIG. 6(d)). About the connection of the external terminals, a structure wherein a support of tungsten supports at three points is desirable. This is because the reliability of the connection can be kept.

(7) Next, thermocouples for controlling temperature were buried in the bottomed holes, which is not illustrated, to finish the manufacture of a hot plate having the resistance heating elements 22.

(8) Next, this hot plate was fitted, through a heat insulator 35 made of a fluorine resin reinforced with glass fiber, into a supporting case 30 having the shape illustrated in FIG. 3 and made of stainless steel.

After the manufacture of the hot plate, the leakage quantity, the thermal conductivity, the oxygen content and so on of the ceramic substrate were measured by the method described later. This hot plate was fitted to the supporting case and then an electric current was sent thereto. The temperature thereof was raised to 300° C., and subsequently

Figure 5:
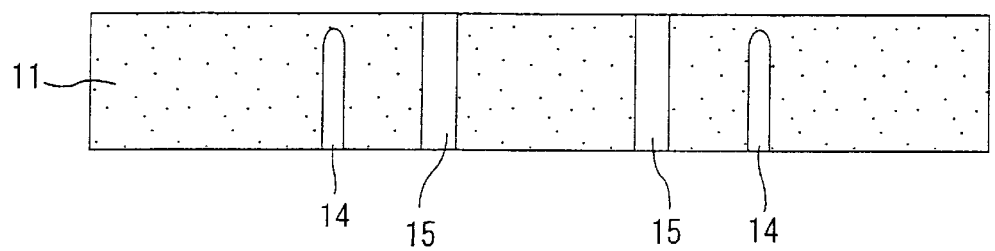
FIGS. 5(a) to (d) are sectional views schematically illustrating parts of the process for manufacturing a hot plate of the present invention wherein resistance heating elements are formed on the bottom face thereof.
Figure 5:
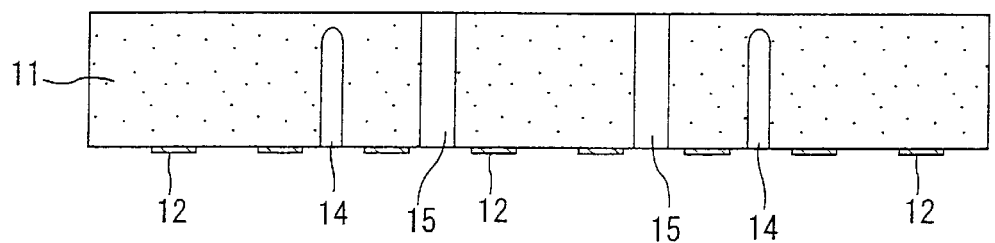
Figure 5:
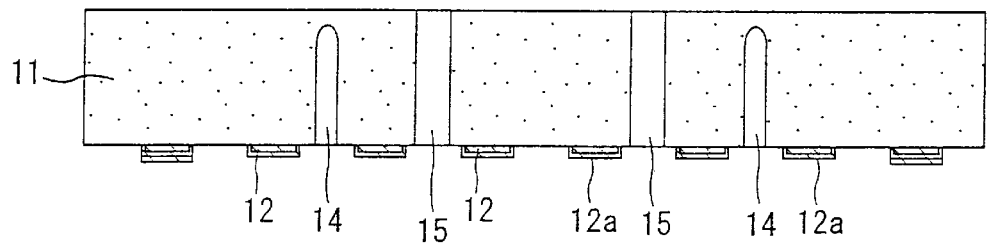
Figure 5:
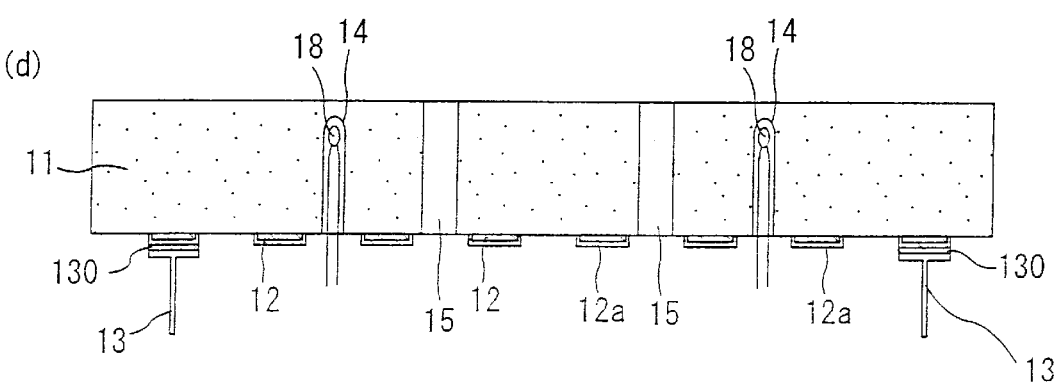

EXAMPLE 8
Manufacture of a Hot Plate (Reference to FIG. 5)

(1) A composition made of 1000 parts by weight of aluminum nitride powder (made by Tokuyama Corp., average particle diameter: 0.6 µm) fired at 500° C. in the air for 1 hour, 40 parts by weight of yttria ($Y_2O_3$, average particle diameter: 0.4 µm) 115 parts by weight of an acrylic binder and an alcohol was subjected to spray-drying to make granular powder.

(2) Next, this granular powder was put into a mold and formed into a flat plate form to obtain a formed body (green) A cool isostatic press (CIP) made of Kobe Steel Ltd. was used to compress this formed body at 300 MPa (3 t/cm$^2$) Thereafter, the surface thereof was ground.

(3) The raw formed body subjected to the above-mentioned working processing was hot-pressed at 1800° C. and a pressure of 20 MPa to obtain a nitride aluminum sintered body having a thickness of 3 mm.

Next, this plate was cut out into a disc having a diameter of 230 mm to prepare a plate (ceramic substrate 11) made of the ceramic (FIG. 5(a)).

Next, this plate was subjected to drilling, so as to make through holes 15 for inserting lifter pins of a silicon wafer, and bottomed holes 14 for inserting temperature-measuring elements 18.

(4) A conductor containing paste was printed on the bottom face of the sintered body obtained in the item (3) by screen printing. The printed pattern was a pattern of concentric circles-like as shown in FIG. 1.

The conductor containing paste was Solvest PS603D made by Tokuriki Kagaku Kenkyu-zyo, which is used to form plated-through holes in printed circuit boards.

This conductor containing paste was a silver-lead paste and contained 7.5 parts by weight of oxides made of lead oxide (5% by weight), zinc oxide (55% by weight), silica (10% by weight) boron oxide (25% by weight) and alumina (5% by weight) per 100 parts by weight of silver. The silver particles had an average particle diameter of 4.5 µm, and were scaly.

(5) Next, the sintered body on which the conductor containing paste was printed was heated and fired at 780° C. to sinter silver and lead in the conductor containing paste and bake them onto the sintered body. Thus, resistance heating elements 12 were formed (FIG. 5(b)). The silver-lead resistance heating elements 12 had a thickness of 5 µm, a width of 2.4 mm and a area resistivity of 7.7 mΩ/□.

(6) The sintered body formed in the item (5) was immersed into an electroless nickel plating bath comprising an aqueous solution containing 80 g/L of nickel sulfate, 24 g/L of sodium hypophosphite, 12 g/L of sodium acetate, 8 g/L of boric acid, and 6 g/L of ammonium chloride to precipitate a metal covering layer (nickel layer) 12a having a thickness of 1 µm on the surface of the silver-lead resistance heating elements 12 (FIG. 5(c)).

(7) A silver-lead solder paste (made by Tanaka Noble Metals) was printed, by screen printing, on portions to which external terminals 13 for ensuring connection to a power source were attached, to form a solder layer.

Next, the external terminals 13 made of Kovar were put on the solder layer and heated and reflowed at 420° C. to attach one end of the external terminals 17, through the solder layer 130, onto the surface of the resistance heating elements 12 (FIG. 5(d)).

(8) Next, this hot plate was fitted, through a heat insulator 35 made of ceramic fiber (trade name: Ibiwool, made by Ibiden Co., Ltd.), into a supporting case 30 having the shape illustrated in FIG. 3 and made of stainless steel.

After the manufacture of the hot plate, the leakage quantity, the thermal conductivity, the oxygen content and so on of the ceramic substrate were measured by the method described later. This hot plate was fitted to the supporting case and then an electric current was sent thereto. The temperature thereof was raised to 300° C., and subsequently a coolant was introduced into the supporting case to cool the hot plate. The time required for the temperature-rising and the temperature-dropping were measured. The results are shown in Table 1 described later.

EXAMPLE 9

The following paste was used to conduct formation by a doctor blade method to obtain green sheets 0.50 mm in thickness: a paste obtained by mixing 100 parts by weight of silicone nitride powder (made by Tokuyama Corp., average particle diameter: 0.6 µm) fired at 500° C. in the air for 1 hour, 40 parts by weight of yttria (average particle diameter: 0.4 µm), 20 parts by weight of alumina, 40 parts by weight of silica, 11.5 parts by weight of an acrylic binder, 0.5 part by weight of a dispersant and 53 parts by weight of alcohols composed of 1-butanol and ethanol.

The green sheets were used to produce a lamination in the same way as in Example 1. The lamination was degreased at 600° C. and then compressed at a pressure of 300 MPa (3 t/cm$^2$) by means of a cool isostatic press (CIP) made by Kobe Steel Ltd. Next, the same way as in Example 1 was performed except that firing conditions were made as follows: a temperature of 1900° C. and a pressure of 20 MPa (200 kg/cm$^2$). In this way, a hot plate was manufactured. The hot plate was set into a supporting case 30.

After the manufacture of the hot plate, the leakage quantity, the thermal conductivity, the oxygen content and so on of the ceramic substrate were measured by the method described later. This hot plate was fitted to the supporting case and then an electric current was sent thereto. The temperature thereof was raised to 300° C., and subsequently a coolant was introduced into the supporting case to cool the hot plate. The time required for the temperature-rising and the temperature-dropping were measured. The results are shown in Table 1 described later.

EXAMPLE 10

The same way as in Example 1 was performed except that press at 30 MPa (300 kgf/cm$^2$) was performed, so as to manufacture a hot plate. The hot plate was set into a supporting case 30.

After the manufacture of the hot plate, the leakage quantity, the thermal conductivity, the oxygen content and so on of the ceramic substrate were measured by the method described later. This hot plate was fitted to the supporting case and then an electric current was sent thereto. The temperature thereof was raised to 300° C., and subsequently a coolant was introduced into the supporting case to cool the hot plate. The time required for the temperature-rising and the temperature-dropping were measured. The results are shown in Table 1 described later.

Comparative Example 1

Manufacture of a Hot Plate

The following paste was used to conduct formation by a doctor blade method to obtain green sheets 0.47 mm in thickness: a paste obtained by mixing 1000 parts by weight of aluminum nitride powder (made by Tokuyama Corp., average particle diameter: 1.1 μm), 40 parts by weight of yttria (average particle diameter: 0.4 μm), 115 parts by weight of an acrylic binder, 5 parts by weight of a dispersant and 530 parts by weight of alcohols composed of 1-butanol and ethanol. Except this formation process, the same way as in Example 1 was performed to manufacture a hot plate. The hot plate was set into a supporting case.

After the manufacture of the hot plate, the leakage quantity, the thermal conductivity, the oxygen content and so on of the ceramic substrate were measured by the method described later. This hot plate was fitted to the supporting case and then an electric current was sent thereto. The temperature thereof was raised to 300° C., and subsequently a coolant was introduced into the supporting case to cool the hot plate. The time required for the temperature-rising and the temperature-dropping were measured. The results are shown in Table 1 described later.

Comparative Example 2

Manufacture of a Hot Plate

The following paste was used to conduct formation by a doctor blade method to obtain green sheets 0.47 mm in thickness: a paste obtained by mixing 1000 parts by weight of aluminum nitride powder (made by Tokuyama Corp., average particle diameter: 1.1 μm), 115 parts by weight of an acrylic binder, 5 parts by weight of a dispersant and 530 parts by weight of alcohols composed of 1-butanol and ethanol. Except this formation process, the same way as in Example 1 was performed to manufacture a hot plate. The hot plate was set into a supporting case.

After the manufacture of the hot plate, the leakage quantity, the thermal conductivity, the oxygen content and so on of the ceramic substrate were measured by the method described later. This hot plate was fitted to the supporting case and then an electric current was sent thereto. The temperature thereof was raised to 300° C., and subsequently a coolant was introduced into the supporting case to cool the hot plate. The time required for the temperature-rising and the temperature-dropping were measured. The results are shown in Table 1 described later.

Comparative Example 3

The same way as in Example 7 was performed except that the amount of yttria was set to 0.2 part by weight, so as to manufacture a hot plate. The hot plate was set into a supporting case.

After the manufacture of the hot plate, the leakage quantity, the thermal conductivity, the oxygen content and so on of the ceramic substrate were measured by the method described later. This hot plate was fitted to the supporting case and then an electric current was sent thereto. The temperature thereof was raised to 300° C., and subsequently a coolant was introduced into the supporting case to cool the hot plate. The time required for the temperature-rising and the temperature-dropping were measured. The results are shown in Table 1 described later.

Comparative Example 4

The same way as in Example 1 was performed except that the firing temperature was set to 1600° C. and no press was performed, so as to manufacture a hot plate. The hot plate was set into a supporting case.

After the manufacture of the hot plate, the leakage quantity, the thermal conductivity, the oxygen content and so on of the ceramic substrate were measured by the method described later. This hot plate was fitted to the supporting case and then an electric current was sent thereto. The temperature thereof was raised to 300° C., and subsequently a coolant was introduced into the supporting case to cool the hot plate. The time required for the temperature-rising and the temperature-dropping were measured. The results are shown in Table 1 described later.

Evaluation Method (1) Thermal Conductivity a. An equipment to be employed

Rigaku-laser flash thermal constant measurement equipment LF/TCM-FA8510B b. Testing conditions temperature: 25° C., 450° C.

ambient condition: vacuum c. Measurement method

The temperature detection in specific heat measurement was carried out by using a thermocouple (Platinel) bounded to the back face of each sample by a silver paste.

Normal-temperature specific heat measurement was carried out by further adhering a light receiving plate (glassy carbon) to the upper face of each sample by silicon grease and the specific heat (Cp) of each sample was calculated according to the following calculation equation (1):

$$Cp = \left\{ \frac{\Delta Q}{\Delta T} - Cp_{G.C} \cdot W_{G.C} - Cp_{S.G} \cdot W_{S.G} \right\} \frac{1}{W} \quad (1)$$

In the above-mentioned calculation equation (1), $\Delta O$ represents the input energy, $\Delta T$ represents the saturation value of the temperature rise of each sample, $Cp_{G.C}$ represents the specific heat of the glassy carbon, $W_{G.C}$ represents the weight of the glassy carbon, $Cp_{S.G}$ represents the specific heat of the silicon grease, $W_{S.G}$ represents the weight of the silicon grease, and W represents the weight of each sample.

(2) Oxygen Content

Samples sintered in the same conditions as those for the sintered bodies of Examples and Comparative Examples were pulverized in a tungsten mortar and 0.01 g of each pulverized sample was measured by the measurement using an oxygen/nitrogen determinator (TC-136 model manufacture by LECO. Co.) under the following conditions: a heating temperature of 2200° C. and a heating time of 30 seconds.

(3) Leakage Quantity

Using samples (area: 706.5 mm$^2$, thickness: 1 mm) sintered in the same conditions as those for the sintered bodies of Examples and Comparative Examples, the leakage quantity was measured by means of a general-purpose type helium leakage detector (MSE-11AU/TP model manufactured by Shimadzu Co.).

(4) Breakdown Voltage

An aluminum foil was closely adhered to the heating face of each sample, and the temperature of the sample was raised to 250° C. A voltage was applied between the external aluminum foil and the back face of the ceramic substrate. Voltage at which dielectric breakdown was caused was measured. Breakdown voltage shown in the following table is a value obtained by dividing this voltage by the thickness of the ceramic substrate. The application of the voltage and the measurement of the voltage at which the dielectric breakdown was caused were performed by means of DCC-30K3T made by Nichicon Co.

(5) Temperature-rising/Dropping Time

A time taken until the temperature of each sample was raised up to 300° C. and a time taken until the temperature was dropped from 300° C. to 100° C. were measured. The temperature-dropping was carried out by blowing air against the sample at 0.1 m³/minute.

Industrial Applicability

As described above, the hot plate of the present invention is sintered to have a leakage quantity of $10^{-7}$ Pa·m³/sec (He) or less according to measurement with a helium leakage detector; therefore, the hot plate is superior in thermal conductivity and is superior in temperature-rising/dropping property, particularly temperature-dropping property.

What is claimed is:

1. A hot plate comprising: a ceramic substrate; and a resistance heating element formed on the surface of said ceramic substrate or inside said ceramic substrate, wherein said ceramic substrate has a leakage quantity of $10^{-7}$ Pa·m³/sec (He) or less by measurement with a helium leakage detector.

2. The hot plate according to claim 1, wherein said ceramic substrate has a disc form and has a diameter of 200 mm or more.

TABLE 1

| | oxygen (% by weight) | pressure (kgf/cm²) | leakage quantity (pa · m²/sec) | thermal conductivity (W/mK) 25° C. | 450° C. | time required for the temperature-rising (min) | time required for the temperature-dropping (min) | breakdown voltage (kV/mm) |
|---|---|---|---|---|---|---|---|---|
| example 1 | 1.6 | 150 | $1 \times 10^{-9}$ | 175 | 87 | 7 | 9 | 10 |
| example 2 | 1.6 | 100 | $3 \times 10^{-9}$ | 175 | 87 | 7 | 9 | 10 |
| example 3 | 1.6 | 80 | $5 \times 10^{-9}$ | 170 | 85 | 7 | 9 | 10 |
| example 4 | 1.6 | 70 | $8 \times 10^{-9}$ | 170 | 85 | 7 | 9 | 10 |
| example 5 | 1.6 | 50 | $8 \times 10^{-9}$ | 170 | 85 | 7 | 9 | 10 |
| example 6 | 1.6 | 0 | $8 \times 10^{-8}$ | 160 | 80 | 8 | 10 | 5 |
| example 7 | 1.6 | 200 | $1 \times 10^{-10}$ | 180 | 90 | 6 | 8 | 15 |
| example 8 | 1.6 | 204 | $1 \times 10^{-10}$ | 180 | 90 | 6 | 8 | 15 |
| example 9 | 2.5 | 200 | $2 \times 10^{-10}$ | — | — | 8 | 10 | 15 |
| example 10 | 1.6 | 300 | $8 \times 10^{-13}$ | 170 | 50 | 8 | 9 | 15 |
| comparative example 1 | 1.6 | 150 | $8 \times 10^{-6}$ | 140 | 40 | 15 | 20 | 0.8 |
| comparative example 2 | <0.05 | 150 | $1 \times 10^{-6}$ | 140 | 40 | 15 | 20 | 0.9 |
| comparative example 3 | <0.05 | 200 | $5 \times 10^{-6}$ | 140 | 40 | 15 | 20 | 0.9 |
| comparative example 4 | 1.6 | 0 | $5 \times 10^{-6}$ | 140 | 40 | 15 | 20 | 0.8 |

As is evident from the results shown in Table 1, in the ceramic substrates constituting the hot plates according to Examples 1 to 10, all of the helium leakage quantities measured with a helium leakage detector were $10^{-7}$ Pa·m³/sec (He) or less and the thermal conductivities thereof were also high. Therefore, the temperature-rising/dropping properties thereof were good. Particularly at the time of cooling, the temperatures of the hot plates dropped to 100° C. in a short time. The breakdown voltages thereof were also high.

On the other hand, in the ceramic substrates constituting the hot plates of Comparative Examples 1 to 4, all of the helium leakage quantities thereof were over $10^{-7}$ Pa·m³/sec (He) Therefore, the thermal conductivities thereof were small and the temperature-rising/dropping properties thereof were not very good. In particular, At the time of the temperature-dropping, relatively large time was required. All of these hot plates had poorer values compared to Examples 1 to 10. The breakdown voltages thereof were also markedly poor.

As described above, the hot plate of the present invention is sintered to have a leakage quantity of $10^{-7}$ Pa·m³/sec (He) or less according to measurement with a helium leakage detector; therefore, the hot plate is superior in temperature-rising property, particularly in temperature-dropping property.

3. The hot plate according to claim 1, wherein said ceramic substrate has a disc form and has a diameter of 300 mm or more.

4. The hot plate according to claim 1, wherein said ceramic substrate has a thickness of 25 mm or less.

5. The hot plate according to claim 1, wherein said ceramic substrate is used at a temperature of 150° C. or higher.

6. The hot plate according to claim 1, wherein said ceramic substrate comprises a nitride ceramic, a carbide ceramic or an oxide ceramic.

7. The hot plate according to claim 1, wherein said ceramic substrate contains 0.05% to 10% by weight of oxygen.

8. The hot plate according to claim 1, wherein said hot plate is used to heat a wafer.

9. The hot plate according to claim 1, wherein a wafer is supported 50 to 200 μm apart from the heating face and heated.

10. The hot plate according to claim 1, wherein said ceramic substrate has a through hole.

* * * * *